US012703915B2

(12) United States Patent
Burdette et al.

(10) Patent No.: US 12,703,915 B2
(45) Date of Patent: Aug. 11, 2026

(54) MINIMIZATION OF CHEMICAL VAPOR INFILTRATION TOOLING HOLE LENGTH THROUGH COUNTERBORES

(71) Applicant: Raytheon Technologies Corporation, Farmington, CT (US)

(72) Inventors: Alyson T. Burdette, Gilbertsville, PA (US); Kathryn S. Read, Marlborough, CT (US); Kenneth Petroski, Anaheim, CA (US)

(73) Assignee: RTX Corporation, Farmington, CT (US)

( * ) Notice: Subject to any disclaimer, the term of this patent is extended or adjusted under 35 U.S.C. 154(b) by 876 days.

(21) Appl. No.: 17/957,613

(22) Filed: Sep. 30, 2022

(65) Prior Publication Data

US 2024/0110280 A1 Apr. 4, 2024

(51) Int. Cl.
*C23C 16/455* (2006.01)

(52) U.S. Cl.
CPC .............................. *C23C 16/45563* (2013.01)

(58) Field of Classification Search
CPC .......... C04B 2235/60; C04B 2235/614; C04B 35/565; C04B 35/80; C23C 16/045; C23C 16/45517; C23C 16/45559; C23C 16/45563; C23C 16/458
See application file for complete search history.

(56) References Cited

U.S. PATENT DOCUMENTS 5,065,696 A 11/1991 Greenberg et al.
5,209,525 A 5/1993 Ito
5,480,678 A 1/1996 Rudolph et al.
6,669,988 B2 12/2003 Daws et al.
7,691,443 B2 4/2010 Rudolph et al.
8,845,806 B2 9/2014 Aida et al.
10,906,205 B2 2/2021 Thibaud et al.
2008/0152803 A1* 6/2008 Lamouroux ........ C23C 16/4587 118/724
2008/0314966 A1 12/2008 Elston et al.
2009/0095221 A1 4/2009 Tam et al.
2012/0193456 A1* 8/2012 Lubomirsky ..... C23C 16/45563 239/548
2012/0309175 A1* 12/2012 Masumura .......... H10P 72/7611 257/E21.09
2014/0363327 A1 12/2014 Holcomb
(Continued)

FOREIGN PATENT DOCUMENTS

CN 110261256 A 9/2019
CN 110978569 A 4/2020
(Continued)

OTHER PUBLICATIONS

KR 20150113620 English Translation (Year: 2015).*
(Continued)

*Primary Examiner* — Xiao S Zhao
*Assistant Examiner* — Victoria Bartlett
(74) *Attorney, Agent, or Firm* — Kinney & Lange, P.A.

(57) ABSTRACT

A tooling assembly suitable for use in infiltrating a fibrous preform comprises a perforated fixture having a thickness. The fixture comprises a plurality of holes extending through the thickness, and a first counterbore aligned with at least one hole of the plurality of holes, the first counterbore having a first length extending partially through the thickness.

16 Claims, 4 Drawing Sheets

(56) References Cited

U.S. PATENT DOCUMENTS

2015/0214009 A1 7/2015 Glukhoy
2016/0196956 A1 7/2016 Zhang et al.
2017/0036400 A1 2/2017 Loeffler et al.
2019/0322004 A1 10/2019 White et al.
2020/0061868 A1* 2/2020 Thibaud ................ C04B 35/565
2021/0053122 A1 2/2021 Socha et al.
2021/0101841 A1 4/2021 Ritchey
2021/0381384 A1 12/2021 Barker

FOREIGN PATENT DOCUMENTS

CN 114686976 A * 7/2022 ............. C30B 25/12
CN 115008791 A 9/2022
EP 3805424 A1 4/2021
JP H02165621 A * 6/1990
KR 20150113620 A * 10/2015 ....... C23C 16/45591

OTHER PUBLICATIONS

English translation of CN114686976A. (Year: 2022).*
English Translation of JPH02165621A. (Year: 1990).*
Extended European Search Report for EP Application No. 23199553.1, dated Mar. 1, 2024, 7 pages.
Extended European Search Report for EP Application No. 23199556.4, dated Mar. 1, 2024, 7 pages.
Extended European Search Report for EP Application No. 23201057.9, dated Feb. 15, 2024, 6 pages.

* cited by examiner

MINIMIZATION OF CHEMICAL VAPOR INFILTRATION TOOLING HOLE LENGTH THROUGH COUNTERBORES

BACKGROUND

The present invention relates to chemical vapor infiltration (CVI), and more particularly to improved tooling for CVI.

Ceramic matrix composite (CMC) parts are widely fabricated by densifying preforms made from woven fabrics or oriented/braided fiber tows. CVI is a commonly used densification technique practiced in industry. To keep the preforms in a rigid form and maintain proper shape and geometry, perforated tooling can be used to hold the preforms during the initial densification cycle(s). Holes in the tooling allow vaporous precursors to infiltrate into the preform for the deposition of a ceramic matrix. Tooling for simple preform can be designed with uniform hole lengths. When used with complexly-shaped preforms, such as turbine airfoils, such holes can be too long to allow vaporous precursors to sufficiently infiltrate the preform at certain locations. Thus, a need exists for improved tooling.

SUMMARY

A tooling assembly suitable for use in infiltrating a fibrous preform comprises a perforated fixture having a thickness. The fixture comprises a plurality of holes extending through the thickness, and a first counterbore aligned with at least one hole of the plurality of holes, the first counterbore having a first length extending partially through the thickness.

A method of counterboring a perforated fixture of a chemical vapor infiltration (CVI) tooling assembly comprises counterboring at least a first hole extending through a thickness of the perforated fixture, and counterboring at least a second hole extending through the thickness of the perforated fixture.

A tooling assembly suitable for use in infiltrating a fibrous preform comprises a perforated fixture having a thickness. The fixture comprises a plurality of holes extending through the thickness, a first counterbore aligned with at least one hole of the plurality of holes, the first counterbore having a first length extending partially through the thickness, and a second counterbore aligned with at least a second hole of the plurality of holes, the second counterbore having a second length extending partially through the thickness.

Figure 1:
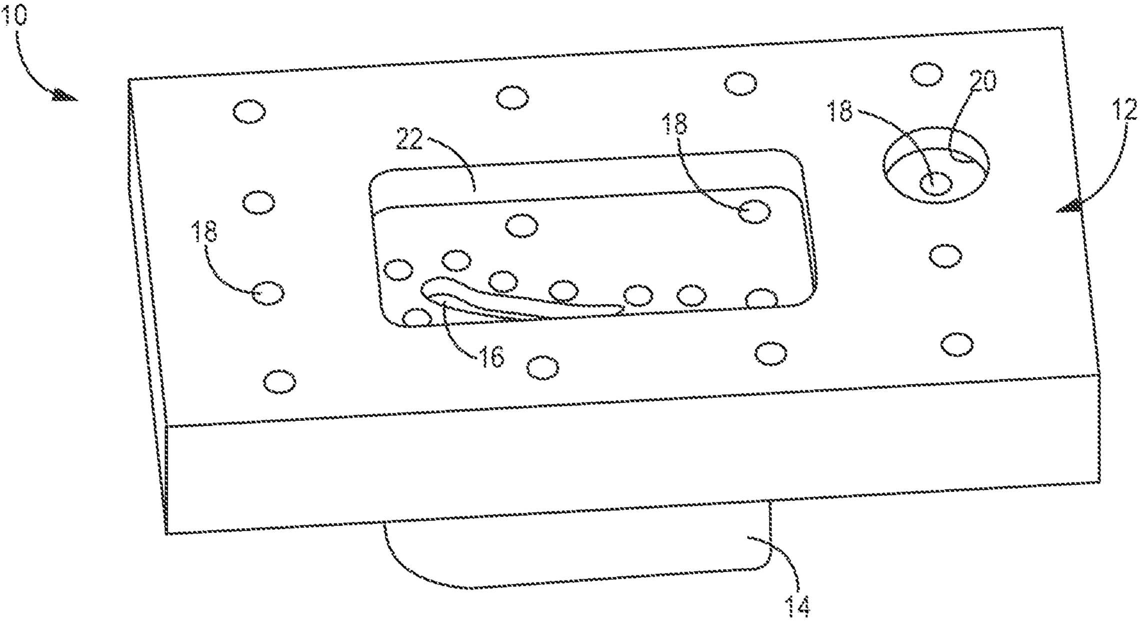
FIG. 1 is a perspective view of a part of a tooling assembly with counterbores.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a CVI tooling assembly with varied hole lengths. More specifically, the disclosed assembly can include tooling fixtures with counterbored holes. Such design provides a flow path for vaporous precursors with an increased diameter along part of the hole relative to traditional designs with holes having uniform diameters.

FIG. 1 is a perspective view of a component of tooling assembly 10. More specifically, FIG. 1 shows fixture 12 of tooling assembly 10, which can be used to support fibrous preform 14. In one embodiment, preform 14 can be an airfoil, and oppositely disposed fixtures 12 can be positioned at the outer diameter and inner diameter ends of the airfoil (e.g., of a blade or vane). In some embodiments, preform 14 can further include inner diameter (ID) and/or outer diameter (OD) platforms. Preform 14 can further be disposed around mandrel 16, one end of which is shown, and which can help removably engage preform 14 with fixture 12. In an exemplary embodiment, preform 14 can be formed from tows of silicon carbide (SiC) fibers arranged in one of various two or three-dimensional woven architectures such as plain, harness (e.g., 3, 5, 8, etc.), twill, braid, or non-symmetric to name a few non-limiting examples. In an alternative embodiment, preform 14 can be formed from non-woven (e.g., chopped, felted, etc.) fibers. Fixture 12 can be part of a multi-piece tooling assembly 10 comprising other fixtures 12 (e.g., cuboids, plates, etc.) in communication with various types and/or portions of a preform (e.g., preform 14). Fixture 12 can be formed from graphite in an exemplary embodiment. Portions of fixture 12 can additionally and/or alternatively be formed from refractory metal alloys, non-graphitic forms of carbon (e.g., carbon-carbon composites) and/or ceramics (e.g., SiC). Such features can include, for example, locating pins. If included, mandrel 16 can also be formed from graphite.

Fixture 12 can have a thickness, and multiple infiltration holes 18 extending completely through thickness. Holes 18 permit the flow of vaporous precursors through fixture 12 during CVI. Fixture 12 further includes multiple counterbores, more specifically, single counterbore 20 and window counterbore 22. Single counterbore 20 is aligned with an existing hole 18 and can have a corresponding rounded shape. Window counterbore 22 is aligned with/overlaps multiple holes 18 and can have a rectangular shape. Other shapes for either type of counterbore are contemplated herein. Further, alternative embodiments can include exclusively one or more individual counterbores 20, and/or one or more window counterbores 22.

Figure 2:
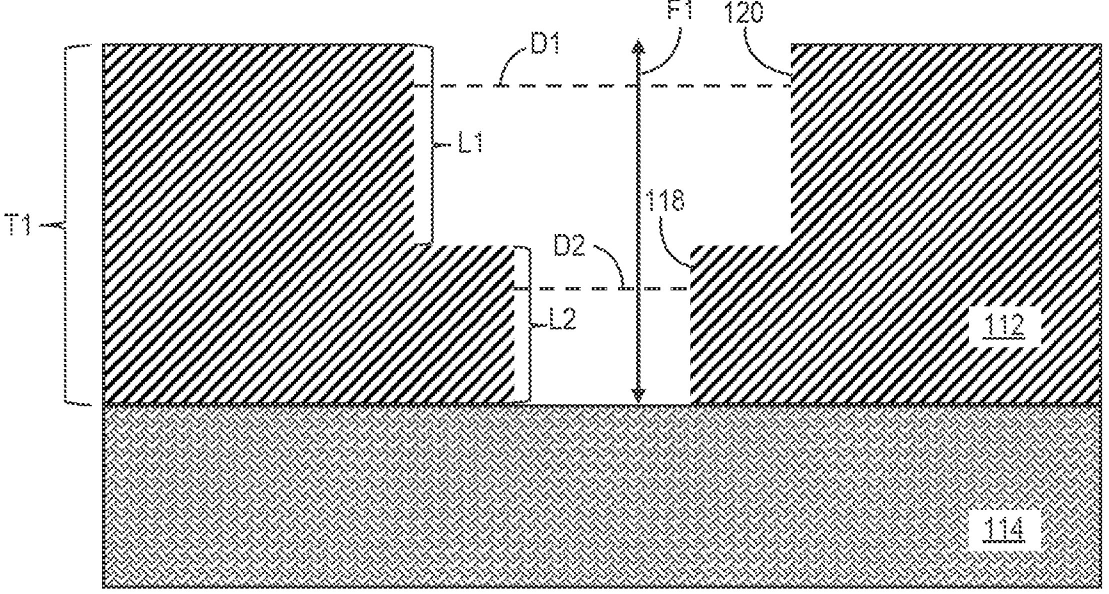
FIG. 2 is a simplified cross-sectional illustration of a counterbore within the tooling assembly.

FIG. 2 is a simplified cross-sectional illustration of a portion of fixture 112 with single counterbore 120 positioned over preform 114. Fixture 112 and preform 114 can be substantially similar to fixture 12 and preform 14, respectively, as described above.

As shown in FIG. 2, counterbore 120 has a depth, or length, L1, and the remainder (i.e., non-counterbore portion) of hole 118 has a length L2. The sum of L1 and L2 can be equivalent to thickness T1 of fixture 112 at the location of counterbore 120 and hole 118. The sum of L1 and L2 can further be equivalent to the length of flow path F1, which represents the distance of the direct path for vaporous precursors travelling through fixture 112 to reach preform 114. Non-counterbore holes 118 (not shown in FIG. 2) can have a length L2 equivalent to T1. Length L1 of various counterbores 120 within fixture 112 need not be equal. Further, counterbore 120 can be relatively shallow, such that L1<L2, relatively deep, such that L1>L2, or can be formed such that L1=L2. Counterbore 120 can also have a diameter D1, and aligned hole 118 can have a smaller diameter D2. Although not shown in FIG. 2, fixture 112 can include one or more window counterbores with similar features, although such a counterbore could overlap with multiple holes 118.

Figure 3:
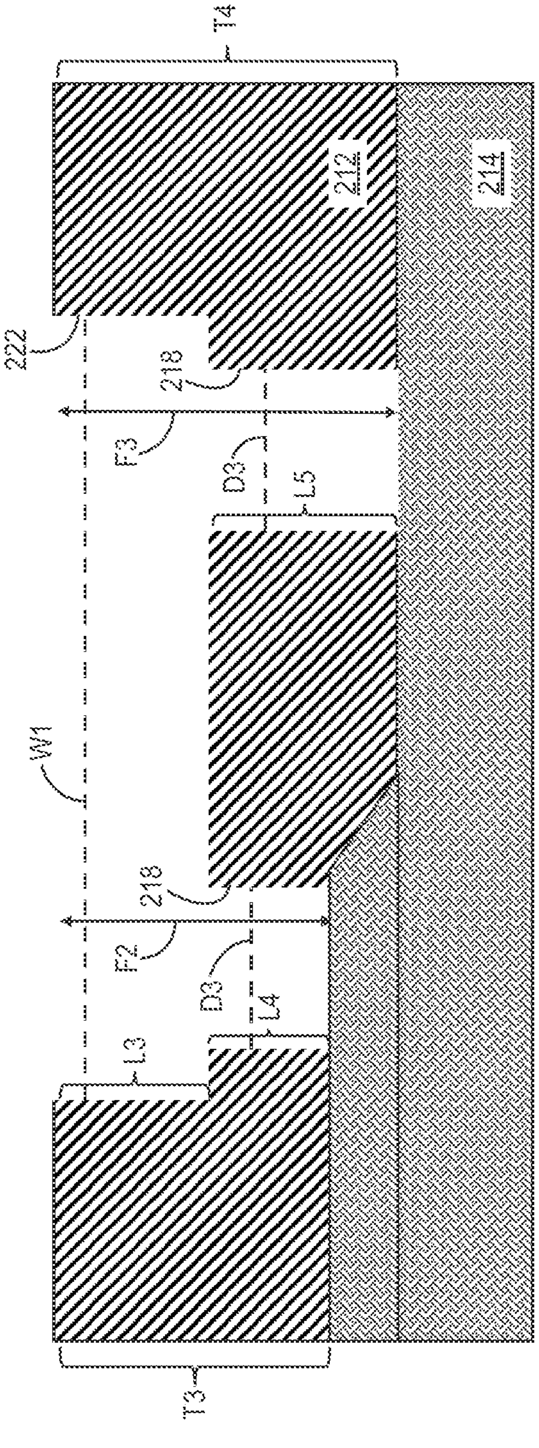
FIG. 3 is a simplified cross-sectional illustration of a tooling assembly showing a first alternative counterbore.
Figure 4:
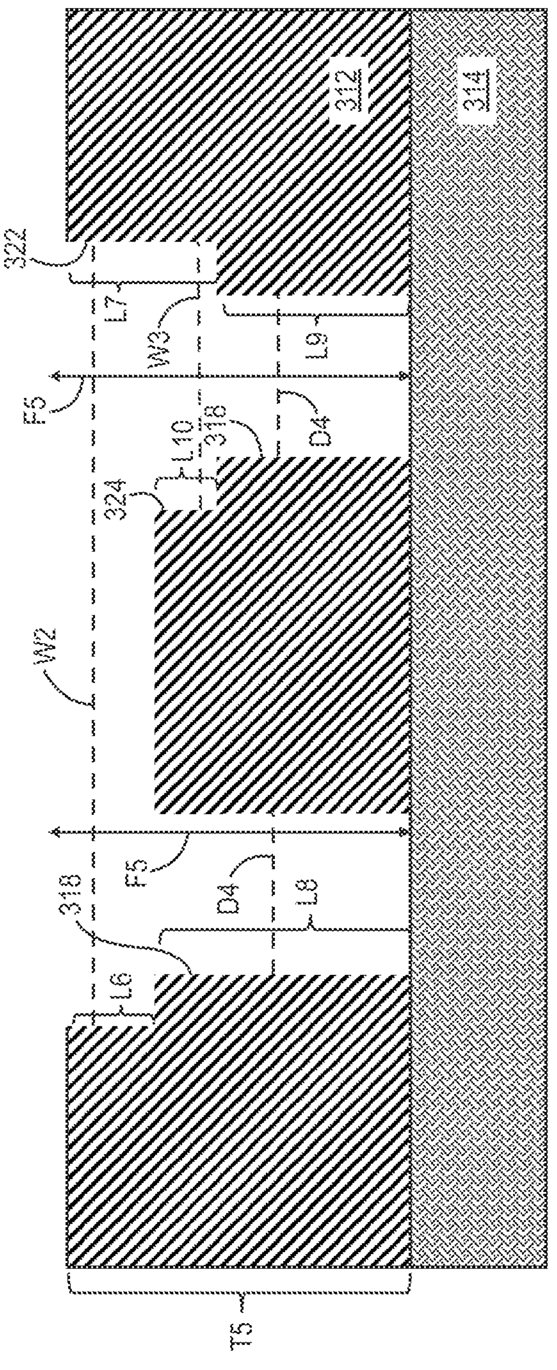
FIG. 4 is a simplified cross-sectional illustration of a tooling assembly showing a second alternative counterbore.

FIGS. 3 and 4 are simplified cross-sectional views of alternative fixtures 212 and 312 with variable window counterbores 222 and 322, respectively. Fixtures 212 and 312, as well as preforms 214 and 314 can be substantially similar to each other, and to fixtures 12 and 112 and preforms 14 and 114, except as discussed below.

Fixture 212, depicted in FIG. 3, can include a variable thickness region partially overlapping with window counterbore 222, with thickness T3<thickness T4 to correspond to a local rise in the profile of preform 214. Such a feature can be associated, for example, with a downward slope in an airfoil tip in the upstream to downstream direction. Window counterbore 222 overlaps with multiple holes 218, although only two are visible in FIG. 3. Window counterbore 222 can have a width W1, and a length (not visible) orthogonal to W1. The depth, or length L3, of window counterbore 222 can be uniform along its area. Because of the varied thickness of fixture 212, a first hole 218 can have a length L4 and a second hole 218 can have a different length L5. As shown, L4<L5. The sum of L3 and L4 can be equivalent to the length of flow path F2, and the sum of L3 and L5 can be equivalent to the length of flow path F3. As shown, F2<F3. Holes 218 can have uniform diameters D3.

Fixture 312, depicted in FIG. 4, can have a uniform thickness T5, but a non-uniform window counterbore 322. Window counterbore 322 can similarly overlap with multiple holes 318 and have a width W2 and orthogonal length (not visible). Overlapping with a first hole 318 is a relatively shallow region of counterbore 322 having a depth, or length L6, and overlapping with a second hole 318 is a relatively deep region of counterbore 322 having length L7. Accordingly, L6<L7. The positioning of the relatively shallow region adjacent the relatively deep region creates a stepped profile defining inset counterbore 324 having a width W3. Each hole 318 can have uniform diameters D4. For the second hole 318 aligned with inset counterbore 324, D4<W3<W2. The features of window counterbore 322 can further create unequal hole lengths, with the first hole 318 having a length L8 and the second hole 318 having a length L9, where L8>L9. Inset counterbore 324 can have a depth, or length L10 on at least one side. The sum of L6 and L8 is equivalent to flow path F5. Because of the uniform thickness of fixture 312, the sum of L7 and L9 is also equivalent to flow path F5, with the flow path (i.e., F5) being the same for both holes 318.

It is possible to include features of any or all of FIGS. 1-4 in a single fixture without departing from the scope of the invention. For example, a fixture can include one or more single counterbores 20 and/or 120 with one or more window counterbores 222 and/or 322. A fixture can further include a window counterbore with both a variable fixture thickness and non-uniform window, as shown in FIGS. 3 and 4. A fixture can additionally have a uniform thickness and a uniform window counterbore (e.g., as shown in FIG. 1). Holes (e.g., 18, 118, 218, 318) need not have a uniform diameter across a fixture, and can further have non cylindrical geometries.

Due to the combination of a single or window counterbore and an infiltration hole, the vaporous precursor flow path is not constrained to a uniform diameter along its entire length, rather, it has a wider portion (i.e., at the counterbore) and a narrower portion (i.e., at the hole). Such arrangement promotes improved mass transfer of vaporous precursor into and/or out of the preform during CVI. The particular hole diameter and counterbore dimension selected can be based on, for example, a desired relationship between L and D, where L is equivalent to the sum of the hole and counterbore lengths, and D is the combination of the hole and counterbore diameters and/or widths, as variously depicted in FIGS. 2-4.

Any of the above fixtures can be formed from an existing tooling fixture with uniform, cylindrical holes. Holes directly aligned with the preform can be selected for counterboring to increase the flow and deposition rate of vaporous precursors. Window counterbores may be preferable for clusters of closely-grouped holes. Traditional counterbore bits can be used to form single counterbores, while machining (e.g., milling, drilling, etc.) can be used to create window counterbores, especially for graphite fixtures.

The disclosed tooling assemblies can be used when infiltrating a preform, via CVI, to deposit interface coatings (e.g., layers of BN, SiC, Si-doped BN, etc.) and/or to form a matrix (e.g., SiC) to create a CMC part. Such CMC parts can be incorporated into aerospace, maritime, or industrial equipment, to name a few, non-limiting examples.

Discussion of Possible Embodiments

The following are non-exclusive descriptions of possible embodiments of the present invention.

A tooling assembly suitable for use in infiltrating a fibrous preform comprises a perforated fixture having a thickness. The fixture comprises a plurality of holes extending through the thickness, and a first counterbore aligned with at least one hole of the plurality of holes, the first counterbore having a first length extending partially through the thickness.

The tooling assembly of the preceding paragraph can optionally include, additionally and/or alternatively, any one or more of the following features, configurations and/or additional components:

In the above tooling assembly, the perforated fixture can be formed from at least one of graphite, a refractory metal alloy, a non-graphitic carbon material, and a ceramic material.

In any of the above tooling assemblies, the first counterbore can have a circular geometry with a first diameter.

In any of the above tooling assemblies, the at least one hole aligned with the counterbore can have a second diameter smaller than the first diameter.

In any of the above tooling assemblies, the at least one hole aligned with the first counterbore can have a second length, and a sum of the first length and the second length can be equal to the thickness of the fixture.

Any of the above tooling assemblies can further include a second counterbore aligned with at least a second hole of the plurality of holes, the second counterbore having a second length extending partially through the thickness.

In any of the above tooling assemblies, the first counterbore can be aligned with a subset of the plurality of holes, the subset including at least three holes.

In any of the above tooling assemblies, the first counterbore can have a rectangular geometry.

In any of the above tooling assemblies, each hole of the subset can have a second length, and a sum of the first length and the second length can be equal to the thickness of the fixture.

In any of the above tooling assemblies, the thickness of the fixture can be non-uniform, and a first hole of the subset can have a first length, and a second hole of the subset can have a second length different from the first length.

In any of the above tooling assemblies, the first counterbore can have a first length and an oppositely disposed second length, the second length being greater than the first length.

Any of the above tooling assemblies can further include a second counterbore aligned with at least a second hole of the plurality of holes distinct from the subset, the second counterbore having a second length extending partially through the thickness.

In any of the above tooling assemblies, the first counterbore can have a circular geometry.

In any of the above tooling assemblies, the fixture can be configured to interface with a fibrous preform.

In any of the above tooling assemblies, the first counterbore and the at least one hole can be configured to align with the fibrous preform.

In any of the above tooling assemblies, the fibrous preform can be formed from silicon carbide.

A method of counterboring a perforated fixture of a chemical vapor infiltration (CVI) tooling assembly comprises counterboring at least a first hole extending through a thickness of the perforated fixture, and counterboring at least a second hole extending through the thickness of the perforated fixture.

A tooling assembly suitable for use in infiltrating a fibrous preform comprises a perforated fixture having a thickness. The fixture comprises a plurality of holes extending through the thickness, a first counterbore aligned with at least one hole of the plurality of holes, the first counterbore having a first length extending partially through the thickness, and a second counterbore aligned with at least a second hole of the plurality of holes, the second counterbore having a second length extending partially through the thickness.

The tooling assembly of the preceding paragraph can optionally include, additionally and/or alternatively, any one or more of the following features, configurations and/or additional components:

In the above tooling assembly, the first counterbore can have a circular geometry and the second counterbore can have a rectangular geometry.

In any of the above tooling assemblies, the perforated fixture can be formed from at least one of graphite, a metallic material, a non-graphitic carbon material, and a ceramic material.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A tooling assembly suitable for use in infiltrating a fibrous preform, the tooling assembly comprising:

a perforated fixture having a thickness defined between a first side and an opposite second side of a monolithic body, the fixture comprising:

a plurality of holes extending through the thickness; and a first counterbore extending partially through the thickness to define a first region in which the thickness is reduced;

wherein a subset of the plurality of holes extends through the first region, the subset comprising at least three holes; and wherein the thickness in the first region is non-uniform, and wherein a first hole of the subset has a first length, and wherein a second hole of the subset has a second length different from the first length.

2. The tooling assembly of claim 1, wherein the perforated fixture is formed from at least one of graphite, a refractory metal alloy, a non-graphitic carbon material, and a ceramic material.

3. The tooling assembly of claim 1 and further comprising: a second counterbore extending partially through the thickness to define a second region in which the thickness is reduced.

4. The tooling assembly of claim 3, wherein the second counterbore has a circular geometry with a first diameter.

5. The tooling assembly of claim 4, wherein at least one hole of the plurality of holes extends through the second region and has a second diameter smaller than the first diameter.

6. The tooling assembly of claim 3, wherein the second counterbore has a circular geometry and the first counterbore has a rectangular geometry.

7. The tooling assembly of claim 3, wherein the thickness in the second region is less than the thickness in the first region.

8. The tooling assembly of claim 1, wherein the first counterbore has a rectangular geometry.

9. The tooling assembly of claim 1, wherein the perforated fixture is configured to interface with a fibrous preform.

10. The tooling assembly of claim 9, wherein the first counterbore and the subset of plurality of holes is configured to align with the fibrous preform.

11. The tooling assembly of claim 9, wherein the fibrous preform is formed from silicon carbide.

12. The tooling assembly of claim 1, wherein a subset of the plurality of holes extends through a second region in which the thickness is unreduced by a counterbore.

13. A tooling assembly suitable for use in infiltrating a fibrous preform, the tooling assembly comprising:

a perforated fixture having a thickness defined between a first side and an opposite second side of a monolithic body, the fixture comprising:

a plurality of holes extending through the thickness;

a first counterbore extending partially through the thickness to define a first region in which the thickness is reduced; and a second counterbore extending partially through the thickness to define a second region in which the thickness is reduced;

wherein at least one of the plurality of holes extends through the first region and a subset of the plurality of holes extends through the second region, the subset comprising at least three holes; and wherein the thickness in the second region is non-uniform, and wherein a first hole of the subset has a first length, and wherein a second hole of the subset has a second length different from the first length.

14. The tooling assembly of claim 13, wherein the first counterbore has a circular geometry, and wherein the second counterbore has a rectangular geometry.

15. The tooling assembly of claim 13, wherein the perforated fixture is formed from at least one of graphite, a metallic material, a non-graphitic carbon material, and a ceramic material.

16. The tooling assembly of claim 13, wherein the thickness in the second region is less than the thickness in the first region.

* * * * *